United States Patent
Pfeiffer et al.

(10) Patent No.: US 6,710,361 B2
(45) Date of Patent: Mar. 23, 2004

(54) MULTI-BEAM HYBRID SOLENOID LENS ELECTRON BEAM SYSTEM

(75) Inventors: Hans C. Pfeiffer, Ridgefield, CT (US); Michael S. Gordon, Lincolndale, NY (US); Maris A. Sturans, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 10/131,709

(22) Filed: Apr. 23, 2002

(65) Prior Publication Data

US 2003/0197131 A1 Oct. 23, 2003

(51) Int. Cl.[7] .................................................. G21K 5/10
(52) U.S. Cl. ............................. 250/492.23; 250/396 R; 250/494.1
(58) Field of Search .......................... 250/492.1, 492.2, 250/492.22, 492.23, 492.3, 494.1, 396

(56) References Cited

U.S. PATENT DOCUMENTS

| | | | |
|---|---|---|---|
| 4,634,874 A | * 1/1987 | Ward | 250/492.2 |
| 4,945,248 A | 7/1990 | Farr | |
| 5,363,021 A | * 11/1994 | MacDonald | 315/366 |
| 5,831,270 A | * 11/1998 | Nakasuji | 250/369 ML |
| 5,962,859 A | 10/1999 | Groves et al. | |
| 5,981,962 A | * 11/1999 | Groves et al. | 250/492.23 |
| 6,175,122 B1 | 1/2001 | Groves et al. | |
| 6,515,282 B1 | * 2/2003 | Veneklasen et al. | 250/310 |

* cited by examiner

*Primary Examiner*—John R. Lee
*Assistant Examiner*—James P. Hughes
(74) *Attorney, Agent, or Firm*—Jay H. Anderson

(57) ABSTRACT

A multi-beam e-beam system employs a set of independently controllable (for blanking and deflection) subsystems placed in a solenoid field, each system having a demagnifying lens comprising at least one passive pole piece, so that the final image demagnifies imperfections in the upstream electron beam. Upper and lower sections of the system employ the focusing effect of the solenoid field to form an image at a shaping aperture and a demagnified image of the beam at the shaping aperture on the workpiece. Small focus corrections due to magnetic lens field non-uniformity and/or target height variations, are accomplished with an electrostatic unipotental lens built into the pole pieces and target voltage variations.

13 Claims, 5 Drawing Sheets

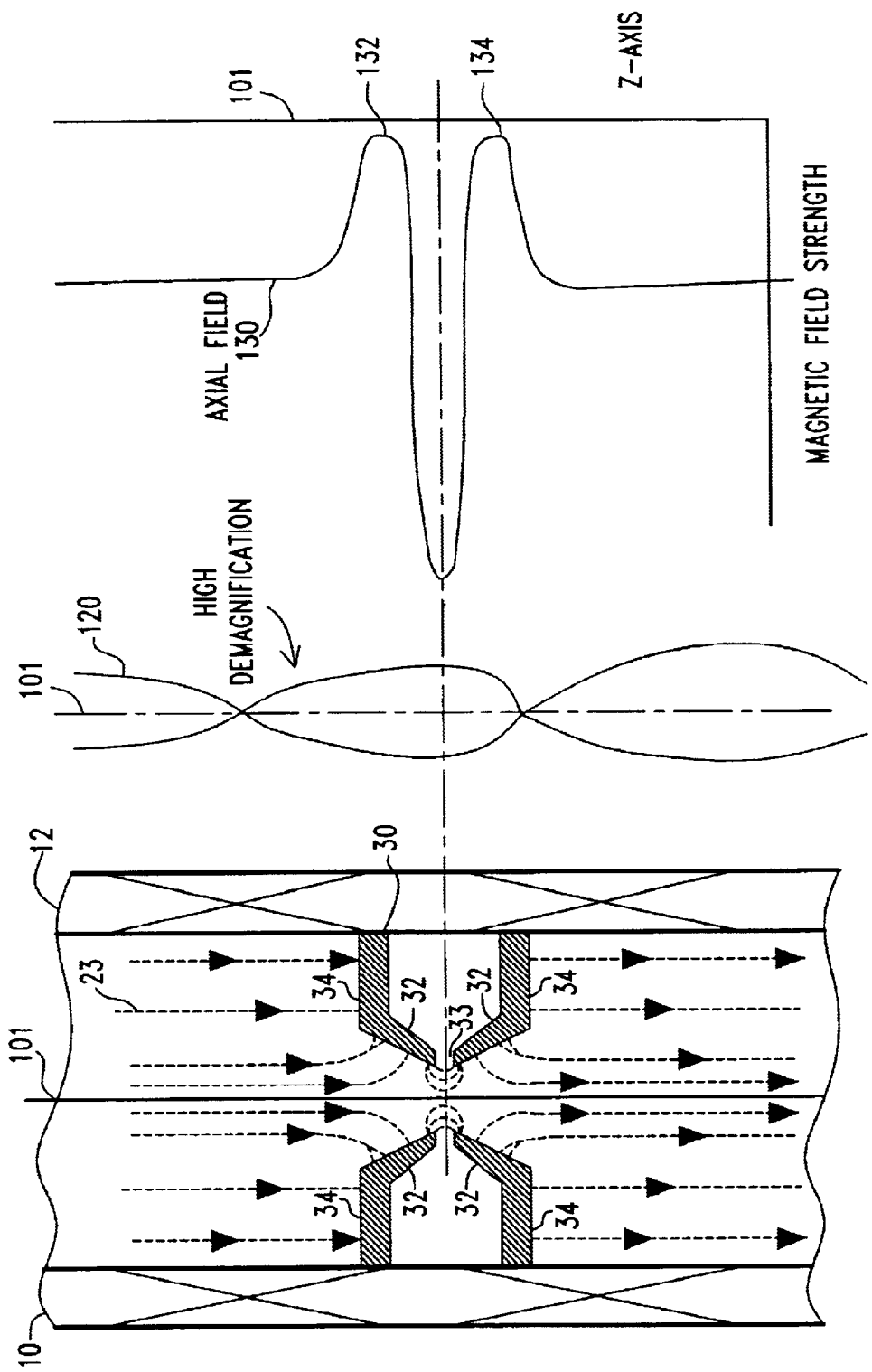

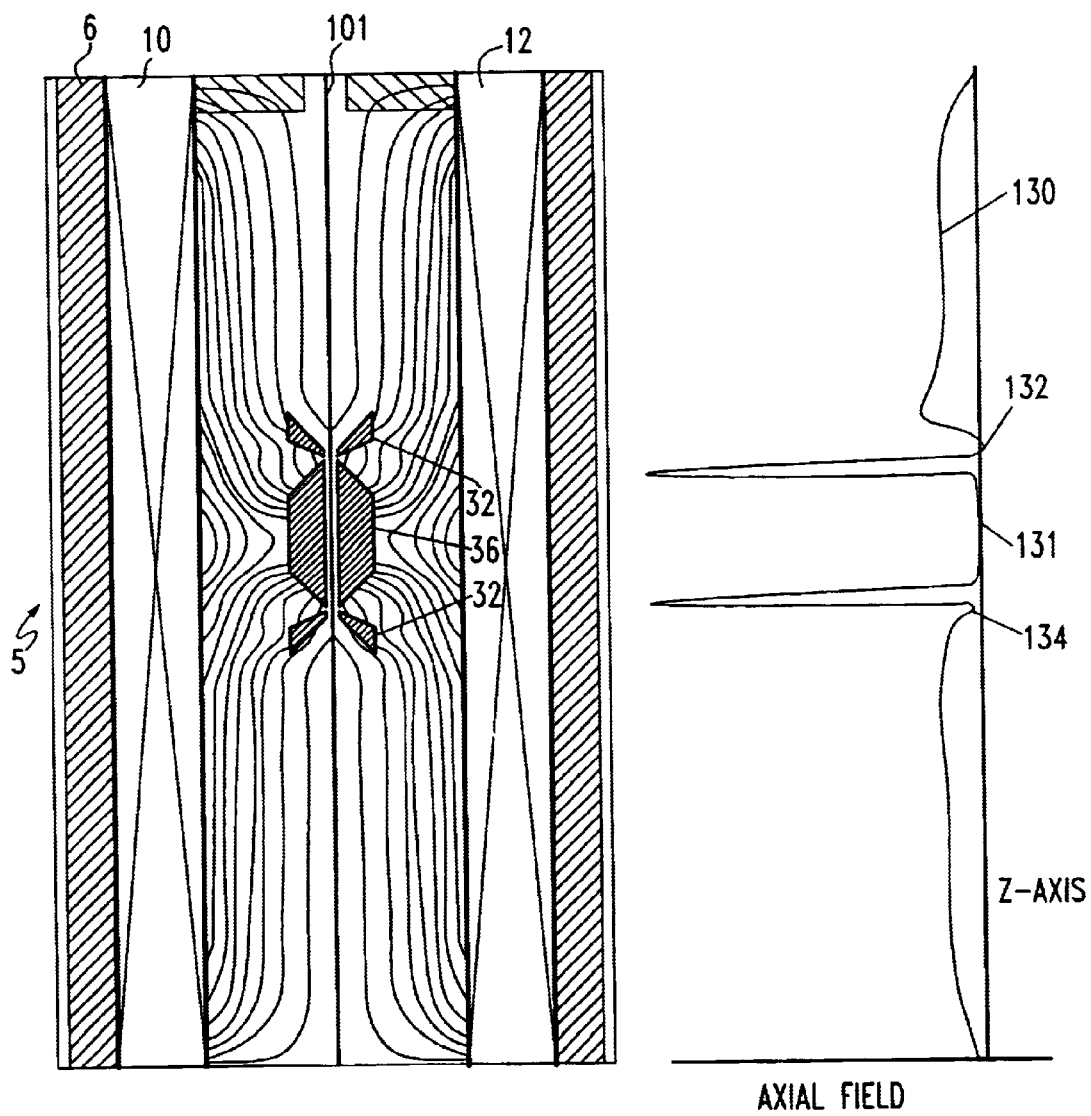
*FIG. 5A*          *FIG. 5B*

MULTI-BEAM HYBRID SOLENOID LENS ELECTRON BEAM SYSTEM

CROSS REFERENCE TO RELATED APPLICATIONS

U.S. patent application Ser. No. 10/132,896, assigned to the assignee hereof and filed concurrently herewith discloses types of lenses useful in the practice of the subject invention and is incorporated by reference herein.

FIELD OF THE INVENTION

The field of the invention is multi-beam electron beam lithography.

BACKGROUND OF THE INVENTION

It is generally accepted in the mask industry that single beam electron beam mask writers will not be able to deliver the current density at high resolution to achieve exposure speeds required for products below 100 nm GR (Ground Rules). The usable current in probe forming systems is limited by stochastic Coulomb interactions, primarily at apertures or beam crossovers, which translates into loss of resolution. By contrast, multibeam systems suffer much less from this problem since the total current delivered to the target is spread over many beams, in most cases, each with its own apertures and crossovers.

Multibeam systems proposed to date have problems with manufacturing feasibility primarily because of unattainable stability and uniformity requirements placed on the electron sources, i.e. field emitters and photocathodes. Some of these systems employ multibeams through part of the optics column but share the same crossover, which does not improve the electron interaction problem. Their stability requirements are further magnified since they typically use 1 to 1 imaging of the source at the target.

A uniform magnetic field (solenoid field) oriented along the electron beam axis is the simplest of electron lenses and has been employed in various electron beam systems. Electrons radiating from a point object execute, by virtue of their transverse velocity component, one cyclotron orbit in the transverse plane, returning to the optic axis. Thus, an image is formed with unity magnification. A major advantage of the solenoid lens is that there is no prescribed optic axis, hence a shift (deflection) of the beam by a transverse field will cause the beam to shift position, but maintain the same focal plane. A major disadvantage of these lenses is that they produce no demagnification of the object, so that defects in the source (reticle, shaping aperture) are reproduced in the image at the same scale.

The restriction of lenses formed by solenoid fields in the prior art to a one-to-one object to image ratio imposes severe limitations on the image quality. It is well known that the conventional object to image ratio of 4:1 in optical steppers is more "forgiving", than a 1:1 demagnification ratio.

Such a 1:1 magnification ratio in a multiple-beam system is illustrated in U.S. Pat. Nos. 6,175,122, 5,981,962 and 5,962,859, which show a plurality of shaped-beam systems, contained within the same solenoid field. In such a system, imperfections in the aperture result in the same imperfections in the image, thus limiting resolution.

SUMMARY OF THE INVENTION

The invention relates to a multi-beam lithography system in which a set of electron beam sub-systems having a substantial demagnification are immersed in a solenoid field and operate in parallel.

A feature of the invention is the use of a single solenoid field common to several electron beam sub-systems.

Another feature of the invention is the use of magnetic lenses having substantial demagnification, so that imperfections in the object are reduced in the image by the demagnification factor.

BRIEF DESCRIPTION OF THE DRAWINGS

FIGS. 4A, 4B and 4C show a cross section of a portion of the invention, an associated beam trace and an associated plot of field strength.

FIGS. 5A, and 5B show a cross section of another embodiment of the invention and an associated plot of field strength.

DESCRIPTION OF THE PREFERRED EMBODIMENT

Figure 1:
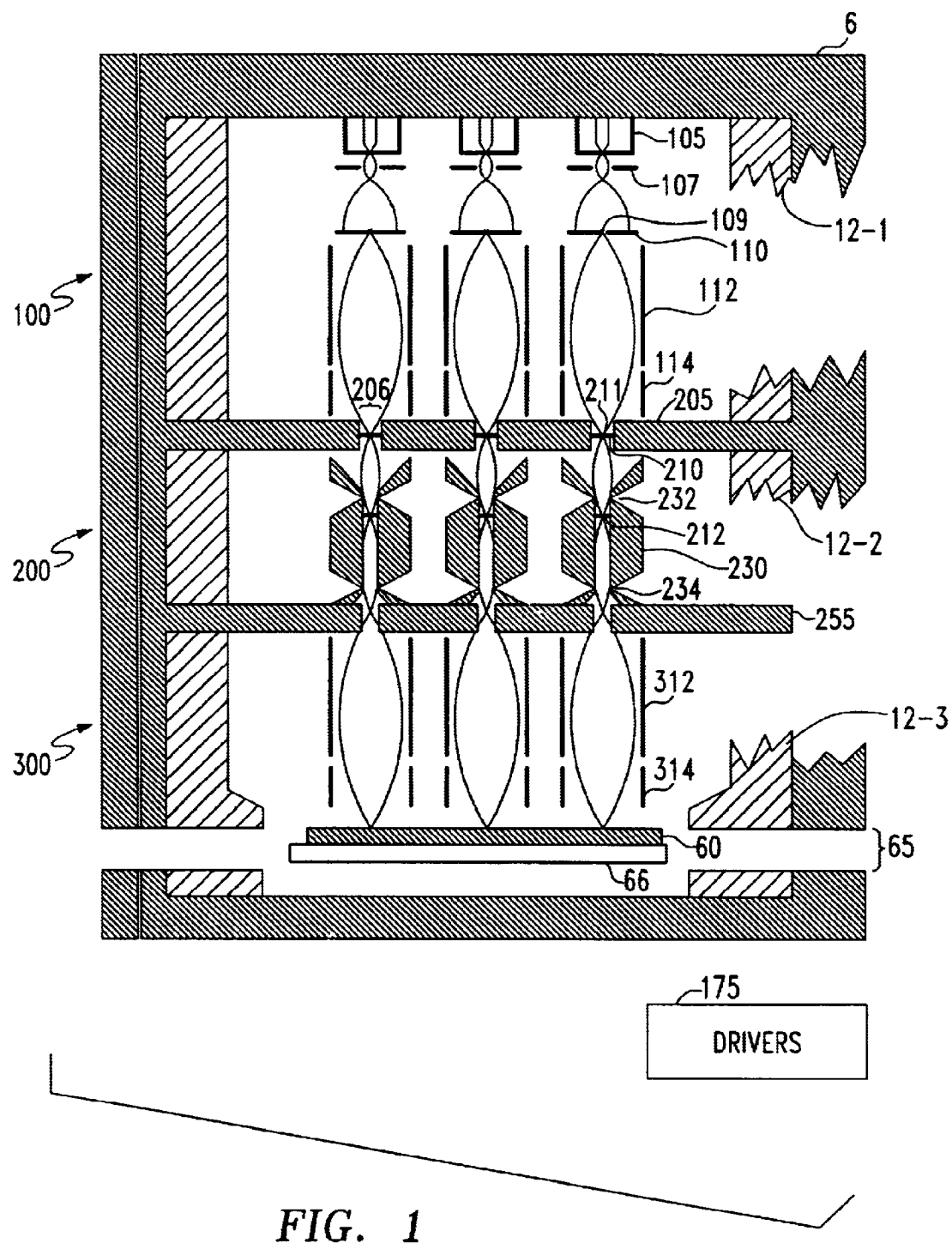
FIG. 1 shows an embodiment of the invention in cross section.

Referring now to FIG. 1, there is shown in cross section an embodiment of the invention having three independently controlled variable shape electron beams apparatus immersed in a common solenoid field. These subsystems (subsystems in the overall multi-beam system) are positioned in close proximity (on the order of 20 mm center-to-center) and simultaneously expose an array of stitched subfields that together expose the full field pattern, illustratively an integrated circuit. The imaging system employs high demagnification of the object, thus suppressing flaws in the source (i.e. the surface of a shaping aperture).

The overall solenoid magnetic field is provided by coils 12-1, 12-2 and 12-3 in sections 100, 200 and 300, respectively. A capped cylinder of any high permeability magnetic material 6, encloses the coils, except for a gap 65 at the bottom for insertion of a workpiece, such as a resist coated substrate for glass mask production, reticle for projection lithography systems or wafer for direct write integrated circuit exposure. The cap also shields the electron beam from undesirable stray magnetic field influences.

In section 100 of each subsystem, electron gun 105, illustratively a conventional cathode of $LaB_6$ crystal that can be controlled and served individually to provide high stability and uniformity, generates the subsystem beam. Electrons emitted from gun 105 are accelerated to anode 107. A first shaping aperture 109 in plate 110 permits the passage of an electron beam having a square cross section, illustratively 175 $\mu$m on a side. Electrostatic deflection plates 112 and 114 deflect the square beam over second shaping aperture 210 in plate 205 to position the square beam from the first shaping aperture appropriately with respect to aperture 210. As is described in U.S. Pat. No. 4,945,246 for a single beam system, each column generates a shaped beam having a shape that may be a vertical line, a horizontal line or a rectangle of desired shape by deflecting the square beam from aperture 109 such that only a beam of the desired shape passes through aperture 210. A solenoid field generated in Section 100 by coil 12-1 focuses an image of the beam emerging from aperture 109 at the plane of aperture 210. The number of ampere turns in Section 100 is selected in conjunction with the accelerating voltage of the beam to provide a beam focus in the desired transverse plane.

Optionally, a plate 205 of the same magnetically permeable material as enclosure 6 separates the first and second sections of the system. An aperture 206 in plate 205 is oversized to permit the beam to strike shaping aperture 210 without striking plate 205.

In Section 200, a demagnifying lens constructed according to the teachings of the referenced copending patent forms a demagnified image of the beam emerging from aperture 210 near the bottom of Section 200. The lenses will be referred to as "passive" since they are not energized by current within the lens, but achieve a focus by affecting the external solenoid field. High permeability plates 205 and 255 separate the magnetic fields in the three sections, reducing the load on the drivers that power the separate solenoid coils and providing the ability to have several different strength solenoids stacked one on top of each other and thus vary the focal length of each section independently. Illustratively, the coil 12-2 for Section 200 is energized with about 2,000 ampere-turns, compound lenses 230 have a magnification of 0.0114, the current density in a beam is about 100A/cm$^2$, and the system generates beam "flashes" having a duration of approximately 50 ns, depending on resist sensitivity, beam energy and current density.

The alignment, shaping, blanking and deflection of each beam is accomplished in each subsystem with electrostatic fields to prevent coupling between adjacent beams and to assure that the focal planes in the solenoid field are not affected. Proper alignment of the beam can be assured throughout the column by superimposing offset voltages on the aforementioned shaping, blanking and deflection elements, as is standard in the art. Conventional electronic circuits for supplying DC voltage, driving the coils and the electrostatic deflectors are shown schematically by box 175 in the lower right of the Figure. Minor refocussing to compensate for demagnification lens field variations and target height changes can be accomplished by introducing a weak Unipotential (Einzel) lens (most easily by utilizing the magnetic lens pole pieces as ground elements and placing a biassed aperture between them), and/or applying a bias voltage to the substrate 60.

At the bottom of the Figure, Section 300 contains deflector plates 312 and 314 that position each beam at a desired location on workpiece 60. In this Figure, workpiece 60 moves in and out of the plane of the drawing on a conventional stage shown schematically as box 66.

A preferred embodiment of the invention having demagnifying lens 230, having upper pole tips 232, lower pole tips 234 and high permeability block 236 produced demagnification greater than 80×, while maintaining spherical and chromatic aberration below 4 mm. Other parameters are: a beam voltage of 10 keV, magnification in the upper lens 232 of 0.133, magnification in the lower lens 234 of 0.086, giving a total demagnification of 87 with $C_{SI}$=3.25 mm, $C_C$=3.83 mm. The excitation of solenoid 12-2 was 2000 ampere-turns. The diameter of magnetic intermediate piece 236 was nominally the same as the electrostatic deflectors and 20 mm. The diameter of the bore through the pole pieces was 4 mm and the lens gaps were 4 mm for the upper and lower sections, with 7 mrad aperture half angle at the second demagnification lens image plane. The aperture in the plane of plate 210 is the object and the plane of plate 255 is the approximate location of the second image plane in this case. At the intermediate image plane 212, there is a limiting aperture that defines the final semi-angle at the target and also minimizes the isotropic off axis aberrations.

Illustratively, the approximate length of the first section was 200 mm, the second 150 mm and the third section 150 mm (to target) for a total system length of approximately 550 mm.

Passive pole pieces 230 in the second section are supported by non-magnetic materials. The deflectors in the first and third sections are supported by non-magnetic, non-conducting materials not shown in the drawing for simplicity.

Figure 2:
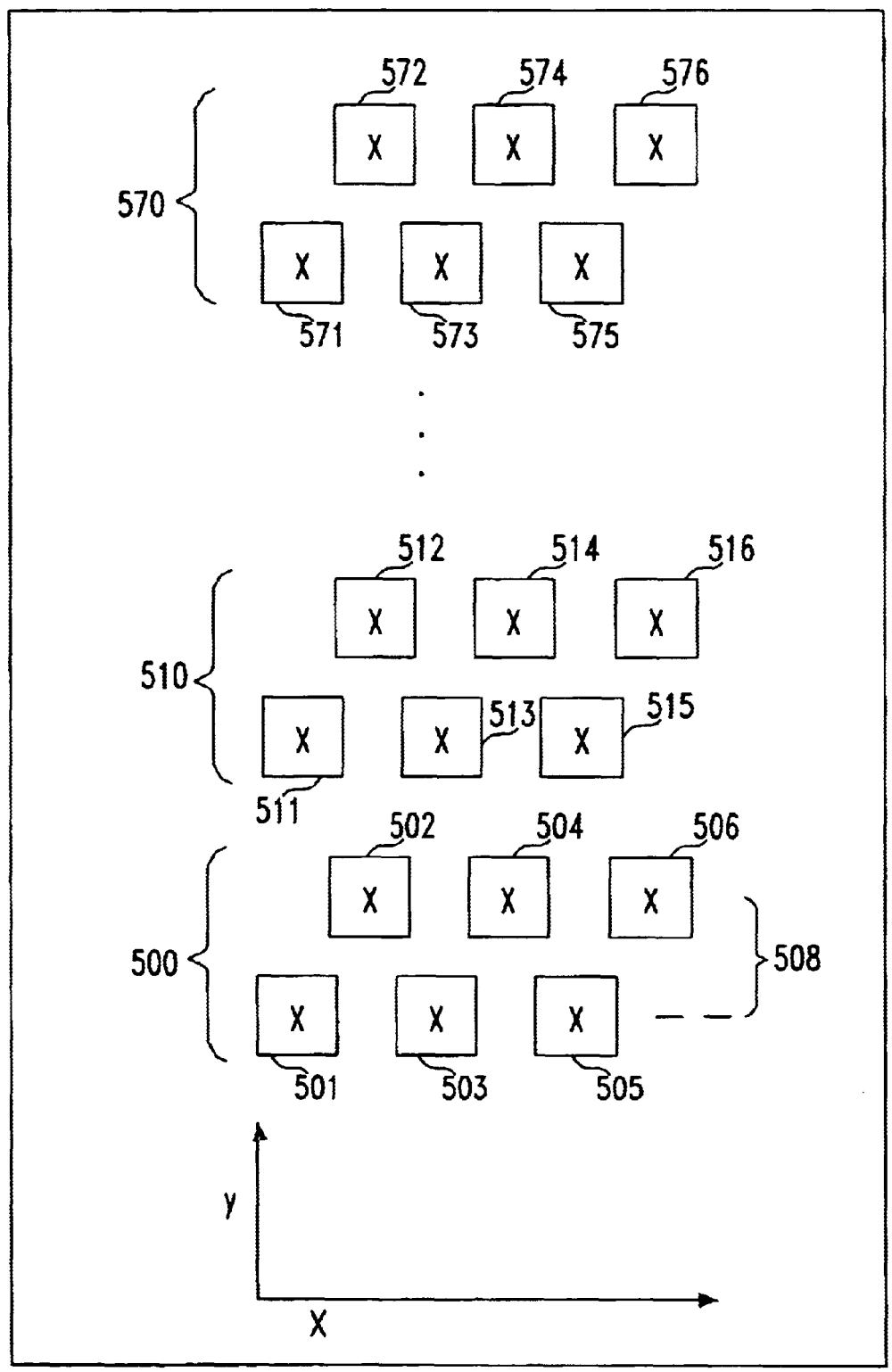
FIG. 2 shows a top view of an embodiment of the invention.

Referring now to FIG. 2, there is shown a top view of some alternative embodiments of the invention. Illustratively, the system is to write a pattern directly on a wafer or on a mask, which is later to be used in a stepper to expose integrated circuit patterns. For a typical 4× stepper, the area to be exposed extends 3 cm by 4 cm, so that the e-beam system mask must cover an area of 12 cm by 16 cm. Boxes 501–506 in the group of two rows denoted by bracket 500 represent schematically e-beam subsystems constructed according to the invention that have an illustrative deflection range of +/−11 mm in the x and y directions. The e-beam systems in the two rows denoted are separated horizontally by 20 mm (e.g. the center of subsystem 503 is 40 mm from the center of subsystem 501 and the x-position of subsystem 502 is located midway between them), so that there is an overlap region of 2 mm in the x-direction. The first and second rows are displaced for convenience in displaying the Figure. Preferably, the two rows are placed with a distance between centers of 20 mm, denoted by bracket 508, and therefore have the same overlap of 2 mm in the y-direction.

Confining our attention for the moment to the group of a single row divided into even and odd sub-rows together labelled 500, a preferred method of operation is to transport the workpiece mechanically (on stage 66 in FIG. 1) vertically downward in FIG. 2. Initially, the systems 502, 504, 506 in the even subrow write a pattern in a first horizontal strip extending 2 cm in the y-direction and subsystems 501, 503 and 505 do not write. Next, the stage is moved by 2 cm in the y-direction, so that the spaces not covered by the even subrow (systems 502–506) in the first step are now covered by systems 501–505 in the odd subrow. The remainder of the first horizontal strip is then written by systems 501–505 while simultaneously systems 502–506 write the next horizontal strip. It will be evident to those skilled in the art that nine iterations will write the desired 16 cm in the y-direction. In the first step, subsystems 501, 503 and 505 do not write and in the ninth step, subsystems 502, 504 and 506 do not write.

Alternatively, additional rows denoted with brackets 510–570 could be provided, so that the groups collectively cover the area to be written. In that case, just two steps will write out the area. On the first step, subsystems 501, 503 and 505 do not write and on the second step, subsystems 572, 574 and 576 do not write.

Figure 3:
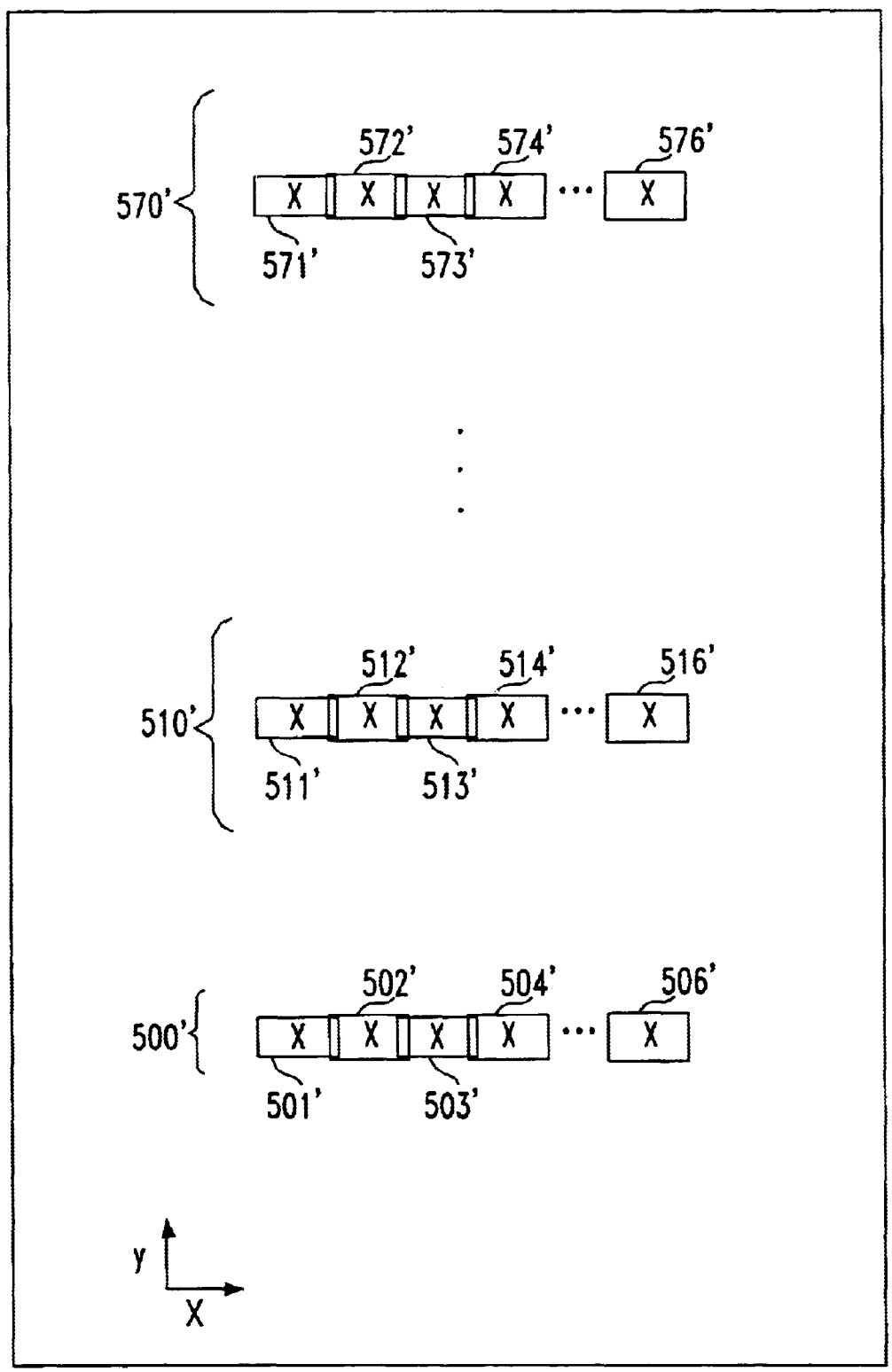
FIG. 3 shows a top view of an alternative embodiment of the invention.

FIG. 3 illustrates an alternative embodiment, in which the systems 501', 502', 506' are all in the same single row. In that case, a single step will write a horizontal strip 2 cm along the y-direction. In this embodiment also, additional rows can be provided to reduce the number of steps. When the groups 500', 510', . . . 570' (eight groups) of rows collectively cover the chip, the entire chip can be written in a single step.

In this discussion, it has been assumed that the spacing between groups (rows) is related to the coverage of a group along the y-axis so that one step will bring the top of the nth group to the bottom of the (n+1)th group (not counting overlap). This is not required in general, and the spacing could be made greater, so that it takes k steps to bring the top of the nth group to the bottom of the (n+1)th group, whether an individual group is a single row, as in group 500' of FIG. 3, or staggered rows, as in group 500 of FIG. 2. This approach would reduce the complexity of the hardware and require a longer time to write the entire pattern.

Referring to FIG. 4A, a simplified passive lens for use in the invention modifies the magnetic field lines to form a demagnification lens. Illustratively, the material is Ferrite™, a ceramic with high magnetic permeability, available from the Ceramic Magnetics company. As is conventional, coils 10 and 12, forming a solenoid field and pole piece 30 have cylindrical symmetry. The axial solenoid field 20 is modified by pole piece 30 to have a very strong peak in the pole piece gap (also referred to as the lens gap) 33 with negative side lobes (relative to the uniform solenoid field). Pole piece 30 has flat top and bottom surfaces 34 and two pole tips 32, having outer surfaces that make an acute angle with respect to the solenoid axis 101. In general, the closer the outer surfaces of pole tips 32 are to the vertical, the sharper the peak in magnetic field trace 130 in FIG. 4C and the deeper the dips in field strength 132 and 134. Preferably, the pole tip surfaces have an angle of less than 45° with respect to the geometric axis. This pole piece configuration has been shown to easily provide demagnification in the 10× range (shown in beam trace 120 in FIG. 2B), with spherical and chromatic aberration coefficients below 3 mm.

Those skilled in the art will appreciate that the unexpectedly low value for the spherical aberration results from the ability of these lenses to create the dips in magnetic field strength 132 and 134, which have no counterparts in a conventional lenses driven by coils contained within the pole pieces.

To achieve even higher demagnification, two or more of these lenses can be used in the same solenoid field, illustrated in FIGS. 5A and 5B. There, pole pieces 32 are the same as those in FIG. 4A. Segments 34 of the poles are not used in this illustration, but could be added to further strengthen the lens field in the pole piece gap, and thereby increase the demagnification. An optional permeable member 36, of the same permeable material, merges with lower pole piece 32 of the upper pair and with the upper pole piece 32 of the lower pair, so that a single piece of material 36 conducts the field lines from the upper gap to the lower gap. A single piece eliminates problems with misalignment between the pieces, but is not required. So long as the three pieces abut and carry the field lines, separate pieces can be used. Filling the region between the two lenses with high permeability magnetic material produces a field free region that can be used for separation and demagnification purposes.

While the invention has been described in terms of a few preferred embodiments, those skilled in the art will recognize that the invention can be practiced in various versions within the spirit and scope of the following claims.

We claim:

1. An electron beam lithography system for controllably directing a set of electron beams at a workpiece comprising:
   at least one solenoid coil for generating a solenoid field parallel to a system axis;
   an array of electron guns for generating a set of initial electron beams travelling within said solenoid field along beam axes parallel to said system axis, said electron guns being disposed in a first solenoid field in a first vertical section of said system, said set of beams having a common focal plane at a set of shaping apertures disposed in a bottom of said first vertical section of said system;
   a set of beam manipulation subsystems, said set of beam manipulation subsystems forming an array of subsystems disposed within said solenoid field and comprising:
   an upper set of electrostatic deflection members in each of said subsystems, for deflecting corresponding ones of said set of electron beams over a set of shaping apertures, thereby generating a corresponding set of shaped beams;
   a set of passive demagnifying lenses, having a fixed demagnification factor, for focusing said corresponding set of shaped beams, reduced in cross section by said demagnification factor, said set of demagnifying lenses being located in a second solenoid field in a second vertical section of said system; and
   a lower set of deflection members for directing said corresponding set of shaped beams on said workpiece,
   in which a third vertical section of said system contains sets of controllable deflection members located in a third solenoid field for deflecting said set of beams to locations on said workpiece, each of said first, second and third solenoid fields focusing said set of beams on common first, second and third focal planes.

2. A lithography system according to claim 1, in which:
   at least one of said set of passive demagnifying lenses comprises first and second passive lenses disposed at first and second locations along a beam axis, whereby said set of passive demagnifying lenses performs demagnification in two steps.

3. A lithography system according to claim 1, in which:
   said second vertical section of said system is separated from said first vertical section of said system and from a third vertical section of said system by plates of magnetically permeable material; and
   each of said first, second and third solenoid fields is driven by a separate coil driver.

4. A lithography system according to claim 2, in which:
   said second vertical section of said system is separated from said first vertical section of said system and from a third vertical section of said system by plates of magnetically permeable material; and
   each of said first, second and third solenoid fields is driven by a separate coil driver.

5. A lithography system according to claim 1, in which:
   said array of subsystems within said solenoid field is disposed in at least one row along a transverse direction at a right angle with respect to a stage direction of motion of said workpiece, whereby said array of subsystems write portions of a pattern on said workpiece simultaneously along said at least one row.

6. A lithography system according to claim 3, in which:
   said array of subsystems within said solenoid field is disposed in a single row along said transverse direction.

7. A lithography system according to claim 3, in which:
   said array of subsystems within said solenoid field is disposed in at least one group of at least two rows disposed along said stage direction, individual ones of said array of subsystems that write adjacent areas along said transverse direction being disposed on different rows in said stage direction.

8. A lithography system according to claim 4, in which:
   individual ones of said array of subsystems that write adjacent areas along said transverse direction are disposed alternately on two rows disposed consecutively in said stage direction.

9. A lithography system according to claim 4, in which:
   said array of subsystems within said solenoid field is disposed in at least two groups of at least one row disposed along said stage direction, whereby portions of at least two rows may be written simultaneously.

10. A lithography system according to claim 8, in which:

said array of subsystems within said solenoid field is disposed in at least two groups, in each of said at least two groups individual ones of said array of subsystems that write adjacent areas along said transverse direction are disposed alternately on two rows disposed consecutively in said stage direction, whereby portions of at least two groups are written simultaneously and portions of a row within one of said groups are written sequentially.

11. A lithography system according to claim 3, in which said array of subsystems within said solenoid field is disposed in a set of rows along said transverse direction that collectively cover said workpiece along said stage direction, whereby said pattern is written in a single step.

12. A lithography system according to claim 9, in which:

said set of groups along said transverse direction that collectively cover said workpiece along said stage direction, whereby said pattern is written in two steps.

13. An electron beam lithography system for controllably directing a set of electron beams at a workpiece comprising:

at least one solenoid coil for generating a solenoid field parallel to a system axis;

an array electron guns for generating a set of initial electron beams travelling within said solenoid field along beam axes parallel to said system axis;

a set of beam manipulation subsystems, disposed within said solenoid field and comprising;

an upper set of electrostatic deflection members in each of said subsystems for deflecting corresponding ones of said set of electron beams over a set of shaping apertures, thereby generating a corresponding set of shaped beams;

a set of passive demagnifying lenses, having a fixed demagnification factor, for focusing said corresponding set of shaped beams, reduced in cross section by said demagnification factor; and a lower set of deflection members for directing said corresponding set of shaped beams on said workpiece, in which;

at least one of said set of passive demagnifying lenses comprises first and second passive demagnifying lenses disposed at first and second locations along a beam axis, whereby said set of passive demagnifying lenses performs demagnification in two steps; and a conductive member having an aperture formed therein is disposed along said beam axis between said first and second locations and is controllably biassed with respect to said pole pieces, whereby said pole pieces form said passive demagnifying lens and said pole pieces and said conductive member together form an electrostatic focus adjustment lens.

* * * * *